(12) United States Patent
Dangelmaier et al.

(10) Patent No.: US 7,719,101 B2
(45) Date of Patent: May 18, 2010

(54) SEMICONDUCTOR DEVICE WITH SURFACE-MOUNTABLE EXTERNAL CONTACTS AND METHOD FOR MANUFACTURING THE SAME

(75) Inventors: Jochen Dangelmaier, Beratzhausen (DE); Horst Theuss, Wenzenbach (DE)

(73) Assignee: Infineon Technologies AG, Neubiberg (DE)

( * ) Notice: Subject to any disclaimer, the term of this patent is extended or adjusted under 35 U.S.C. 154(b) by 316 days.

(21) Appl. No.: 11/627,670

(22) Filed: Jan. 26, 2007

(65) Prior Publication Data

US 2007/0170577 A1    Jul. 26, 2007

(30) Foreign Application Priority Data

Jan. 26, 2006  (DE) .................. 10 2006 003 931

(51) Int. Cl.
H01L 23/48 (2006.01)
(52) U.S. Cl. .................... 257/693; 438/108
(58) Field of Classification Search ........... 257/779, 257/E21.511, 684, 737, 738, 693; 438/108
See application file for complete search history.

(56) References Cited

U.S. PATENT DOCUMENTS

| | | | | |
|---|---|---|---|---|
| 5,889,326 A | * | 3/1999 | Tanaka | 257/737 |
| 5,892,273 A | * | 4/1999 | Iwasaki et al. | 257/690 |
| 5,914,536 A | | 6/1999 | Shizuki et al. | |
| 5,999,413 A | * | 12/1999 | Ohuchi et al. | 361/772 |
| 6,379,999 B1 | * | 4/2002 | Tanabe | 438/113 |
| 6,441,316 B1 | | 8/2002 | Kusui | |
| 6,730,589 B2 | * | 5/2004 | Hashimoto | 438/613 |
| 6,768,062 B2 | | 7/2004 | Morimoto et al. | |
| 2005/0012214 A1 | * | 1/2005 | Nakamura et al. | 257/738 |
| 2005/0087851 A1 | | 4/2005 | Fuergut et al. | |
| 2005/0269696 A1 | * | 12/2005 | Ochiai | 257/734 |
| 2006/0175691 A1 | | 8/2006 | Dangelmaier et al. | |

FOREIGN PATENT DOCUMENTS

| | | |
|---|---|---|
| CA | 2346914 A1 | 1/2007 |
| JP | 57152139 A | 8/1982 |
| JP | 11233936 A | 8/1999 |
| WO | 2005069024 A1 | 1/2007 |

* cited by examiner

*Primary Examiner*—Steven Loke
*Assistant Examiner*—Kimberly M Thomas
(74) *Attorney, Agent, or Firm*—Edell, Shapiro & Finnan, LLLC (57) ABSTRACT

A semiconductor device includes surface-mountable external contacts on an underside of the semiconductor device, wherein the external contacts are arranged on external contact pads and surrounded by a solder-resist layer. The external contacts of the outer edge regions include external contact pads that merge into inspection tags, wherein the inspection tags can be wetted by solder and are not covered by the solder-resist layer.

13 Claims, 9 Drawing Sheets

SEMICONDUCTOR DEVICE WITH SURFACE-MOUNTABLE EXTERNAL CONTACTS AND METHOD FOR MANUFACTURING THE SAME

CROSS REFERENCE TO RELATED APPLICATIONS

This application claims priority under 35 U.S.C. §119 to Application No. DE 102006003931.9 filed on Jan. 26, 2006, entitled "Semiconductor Device Having Surface-Mountable External Contacts and Method for its Manufacture," the entire contents of which are hereby incorporated by reference.

BACKGROUND

As the number of surface-mountable external contacts on an underside of a semiconductor device increases, there is the risk that larger areas of external contacts will not be fixed reliably onto corresponding contact pads of a parent circuit board during surface mounting. The rising number of external contacts per semiconductor device and relentless miniaturization of the external contact sizes increase this risk. In particular for semiconductor devices manufactured using the WLP process (wafer level package process), the size of the surface-mountable external contacts are reduced to such an extent that an inspection using x-rays, for example, to check for reliable bonding or surface mounting is costly and time-consuming.

Even using visual systems such as a stereo microscopic examination to inspect from the side is time-consuming and not suitable for mass production. The problem with visual inspection of reliable electrical bonding is exacerbated by the external contacts not being arranged immediately at the lower outer edges of the semiconductor device; instead, they tend to be positioned at an edge offset from the lower outer edges of the semiconductor device. This makes visual inspection more difficult, for example checking whether a meniscus of solder has been formed between an external contact pad of a semiconductor device and a contact pad of a parent circuit board.

Figure 17:
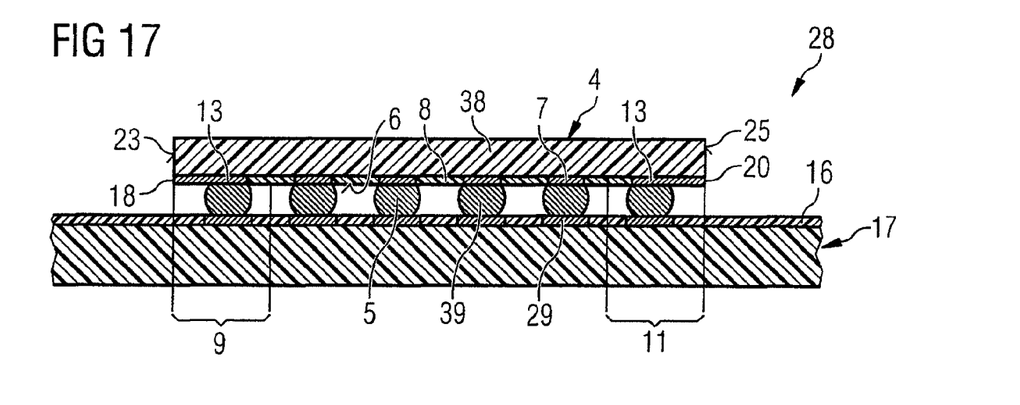
FIG. 17 shows a schematic cross-section through a semiconductor device arrangement with a semiconductor device according to prior art.

This is illustrated in FIG. 17, which shows a schematic cross-section through a semiconductor device arrangement 28 with a surface-mountable semiconductor device 4 according to the prior art. This semiconductor device 4 is mounted by its surface-mountable external contacts 5 on contact pads 29 of a parent circuit board 17. Visual inspection of the lower outer edges 18 and 20 of the semiconductor device 4 is extremely difficult, especially as the external contact pads 13 for the external contacts 5 in the outer edge regions 9 and 11 are not arranged immediately at the lower outer edges 18 and 20. This makes visual inspection of a solder meniscus, which is formed in a reliable solder connection of the external contacts 5 onto the contact pads 29 of a parent circuit board 17, more difficult, and in many cases this is only possible in the outer edge regions 9 and 11 using highly complex technology and equipment.

Figure 18:
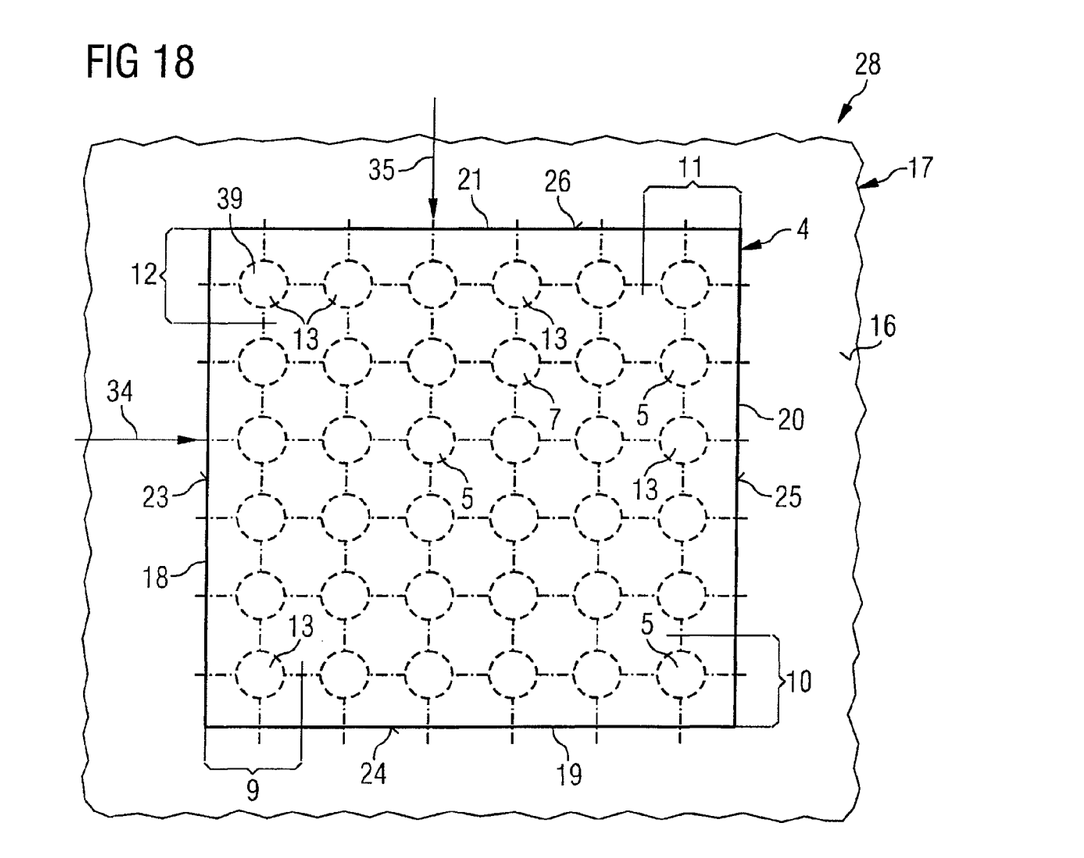
FIG. 18 shows a schematic plan view of the semiconductor device arrangement of FIG. 17.

FIG. 18 shows a schematic plan view of the semiconductor device arrangement 28 of FIG. 17. The external contacts 5 arranged in rows 34 and columns 35 on the external contact pads 7 and 13 are not visible in this plan view and are hence identified by dashed lines. Thus examining or inspecting a reliable electrical connection between the parent circuit board 17 and the semiconductor device 4 when viewed from above is only possible by a technically complex X-ray examination of the semiconductor device 4 and the circuit board 17 in this semiconductor device arrangement 28.

SUMMARY

A semiconductor device includes surface-mountable external contacts on an underside of the semiconductor device, wherein the external contacts are arranged on external contact pads and surrounded by a solder-resist layer. The external contacts of the outer edge regions include external contact pads that merge into, (i.e., electrically connected to), inspection tags, wherein the inspection tags can be wetted by solder and are not covered by the solder-resist layer.

The above and still further features and advantages of the described semiconductor device and method will become apparent upon consideration of the following definitions, descriptions and descriptive figures of specific embodiments thereof, wherein like reference numerals in the various figures are utilized to designate like components. While these descriptions go into specific details of the semiconductor device and method, it should be understood that variations may and do exist and would be apparent to those skilled in the art based on the descriptions herein.

BRIEF DESCRIPTION OF THE DRAWINGS

The semiconductor device and method are explained in more detail below with reference to exemplary embodiments, where.

DETAILED DESCRIPTION

The described method improves the reliability of surface mounting by surface-mountable external contacts of a semiconductor device, and enables simplified inspection, by creating a semiconductor device that supports reliable and rapid visual inspection.

Accordingly, a semiconductor device is created with surface-mountable external contacts on an underside of the semiconductor device. The external contacts are arranged in this case on external contact pads and surrounded by a solder-resist layer. The external contacts in the outer edge regions include external contact pads that differ from the external contact pads in the central region in that the external contact pads in the edge regions of the semiconductor device merge into, (i.e., electrically connected to), inspection tags. These inspection tags, which extend up to the lower outer edges of the semiconductor device, can be wetted by solder and are not covered by the solder-resist layer.

Such a semiconductor device has an advantage that for surface mounting, at least the external contacts arranged in the edge region can be inspected for a reliable electrical solder connection. To do this, a check must simply be made that the solder from contact pads of a parent circuit board has wetted the inspection tags, which extend up to the lower outer edges of the semiconductor device. Thus, it is possible by a simple visual inspection to check whether or not a semiconductor device patterned and designed in such a way has been surface-mounted reliably. It is assumed in this case, that if all the external contacts in the edge regions of the semiconductor device have definitely been bonded, then the central region has also been bonded reliably.

The inspection tags of the external contact pads of the outer edge regions preferably extend orthogonally from the row of the outer external contacts to lower outer edges of the semiconductor device. This orthogonality ensures that the inspection tags are of minimum length, thereby guaranteeing that these inspection tags can be wetted completely by the solder of the contact pads of a circuit board.

In a further exemplary embodiment, the lower outer edges of the semiconductor device are chamfered. Inspection tags arranged at right angles to the chamfers of the outer edges have an advantage that an inspection to check surface mounting of the external contacts is simplified because inspection from the side of the inspection tags on the chamfered lower outer edges of the semiconductor device on the parent circuit board can be performed easily and reliably.

In addition, it is possible that the inspection tags of the external contact pads of the outer edge regions extend orthogonally from the row of the outer external contacts out over the lower outer edges of the semiconductor device and are arranged on edge faces of the semiconductor device. In this case, the edge faces of the semiconductor devices are wetted with solder at the inspection-tag positions in surface mounting, so that semiconductor devices patterned in such a way make it possible for inspection of a reliable surface mount to be improved further.

The semiconductor device preferably includes on its underside an interconnect pattern on which are arranged, in a ring formation, external contact pads with and without inspection tags. The external contact pads without inspection tags are arranged in this case on inner rings, and the external contact pads with inspection tags surround this area as an outer ring. The inspection tags extend from the outer ring towards the lower outer edges of the semiconductor device. This embodiment has the advantage that inspection tags are only arranged where it is possible to visually inspect the inspection-tag wetting.

In addition, it is provided that the semiconductor device includes metallized edge-face patterns, which are in electrical contact with the inspection tags. In addition, to improve visual inspection, the edge-face patterns can be made wider than the inspection tags of the external contact pads in the outer edge regions. Such wide edge-face patterns can be provided in the dicing tracks back at the patterning stage of the semiconductor wafer by making recesses in the dicing tracks. The walls of these recesses can be metallized at the same time as metallization of the external contact pads and the inspection tags, so that the coating of the walls of the recesses forms a metallization of the edge-face pattern of the semiconductor devices after the dicing process.

In a similar manner, it is also possible in the wafer level package process to make recesses in the dicing tracks whose walls are also metallized when inspection tags and external contact pads are metallized. When dicing the composite board created in the wafer level package process, the metallized recesses in the dicing grooves produce the metallized edge-face patterns on the semiconductor device, which are in electrical contact with the inspection tags.

Another aspect of the described device relates to a semiconductor device arrangement made of a semiconductor device and a parent circuit board. For this arrangement, the semiconductor device includes on its underside surface-mountable external contacts on external contact pads comprising inspection tags in edge regions. The circuit board of this semiconductor device arrangement includes solder-coated contact pads that are designed to match the external contacts of the semiconductor device in terms of size and arrangement. The semiconductor device is soldered by its external contacts onto the contact pads of the circuit board, and the inspection tags in the edge regions of the semiconductor device are wetted by the solder of the contact pads and comprise a solder meniscus.

This semiconductor device arrangement has an advantage that the electrical connection of the external contacts of the semiconductor device to the contact pads of the circuit board can be visually inspected, even though the external contacts are surface mountable. This inspection capability is based on the fact that when soldering the semiconductor device onto the circuit board, a semiconductor device arrangement is produced that has inspection tags on the edge faces of the semiconductor device that are wetted by the solder of the contact pads of the circuit board, so that the resultant meniscus of the semiconductor device arrangement can be inspected visually.

It is assumed here that when the solder meniscus is formed perfectly in all edge regions of the semiconductor device, or specifically its inspection tags, the external contacts in the central region of the semiconductor device also have a reliable electrical connection between the external contact pads of the semiconductor device and the contact pads of the circuit board in this region. This semiconductor device arrangement thus has an advantage that after surface mounting of the semiconductor device on the circuit board, the connection between semiconductor device and circuit board can be inspected visually and at low cost for a multiplicity of external contacts.

A method for manufacturing a plurality of semiconductor devices including surface-mountable external contacts comprises the following. First, the underside of a panel is patterned, the panel comprising a plurality of semiconductor device locations with interconnect patterns on the underside. The interconnect patterns on the underside of the semiconductor device locations comprise external contact pads arranged in rows and columns in the semiconductor device locations such that dicing tracks between the semiconductor device locations are crossed by conductors to form inspection tags. To this end, the conductors on the dicing tracks connect together two external contact pads in facing outer edge regions of adjacent semiconductor device locations.

In this context, a panel is also understood to mean a composite board, which in the wafer level package process has a co-planar surface formed from upper faces of semiconductor devices and plastic compound, on which is arranged the interconnect pattern comprising external contact pads and inspection tags. A panel can also be understood to mean a semiconductor wafer comprising semiconductor device locations arranged in rows and columns, wherein the semiconductor devices diced from the semiconductor wafer have flip-device contacts and hence constitute semiconductor devices in device scale format.

As a further step, the method for manufacturing a plurality of semiconductor devices provides that the panel is diced along the dicing tracks into single semiconductor devices, with inspection tags for the external contact pads being formed in the edge regions. In this case, the inspection tags are created from the conductors crossing the dicing tracks. This method has an advantage that it merely requires a new design of the interconnect pattern on the underside of a panel in order to enable reliable connection of a semiconductor device to a circuit board capable of inspection. A multiplicity of solder-wettable inspection tags that can be inspected visually are produced by the dicing of the conductors arranged in the dicing tracks.

In an exemplary implementation of the method, the panel is provided with external contacts prior to dicing the panel into single semiconductor devices. This has an advantage that the external contacts do not need to be applied to individual semiconductor devices, but can be arranged for a plurality of semiconductor devices on the panel at a time.

In a further example implementation of the method, to manufacture a plurality of semiconductor devices a substrate is provided including an interconnect pattern for mounting the semiconductor components on the top side of the substrate. For this purpose, the interconnect pattern comprising external contact pads and inspection tags is applied to the underside of the substrate. Such a method version has an advantage that by using such a substrate, semiconductor devices can be manufactured having high rigidity and strength because of the substrate.

Before or after the panel is diced, solder balls as external contacts are preferably soldered onto the external contact pads without wetting the inspection tags with solder, especially as the inspection tags are intended to be wetted after mounting a single semiconductor device onto a parent circuit board.

In an alternative method, prior to mounting the semiconductor components on the un-diced panel, external contact feet instead of solder balls are deposited on the external contact pads without coating the inspection tags. The deposited external contact feet extend in area over the same area as the external contact pads. This method version has an advantage that extremely flat external contacts can be formed. This method also has an advantage that a multiplicity of external contacts can be formed at the same time without aligning individual solder balls on the external contact pads.

In addition, it is provided that for a preferred embodiment, the dicing tracks are chamfered by a profile saw blade or by an etching process prior to applying the conductors crossing the dicing tracks, and subsequently an interconnect pattern is applied comprising the conductors crossing the dicing tracks. By making chamfers in the dicing tracks, on applying the interconnect pattern comprising conductors that cross the chamfered dicing tracks, inspection tags are advantageously formed that can be visually inspected more easily at the lower outer edges of the semiconductor devices, because the solder-wettable inspection tags now extend in three dimensions onto the edge faces of the semiconductor devices.

Alternatively, mutually spaced recesses can be made in the dicing tracks of the panel. The number and spacing of the recesses is designed to match the number and spacing of the external contact pads in the outer edge regions of the semiconductor device locations and the conductors crossing the dicing tracks. The walls of the recesses are metallized at the same time as the conductors crossing the dicing tracks, so that the crossing conductors are electrically connected to the metallization of the recesses. The recesses are designed to extend over a larger area than the dicing track made in the panel for dicing the panel into single semiconductor devices. The fact that the recesses extend over a larger area ensures that after dicing the panel into single semiconductor devices, metallized and wettable edge-face patterns are produced on the edge faces of the semiconductor devices, which make inspection of a reliable connection between the semiconductor device and the parent circuit board easier.

Another method relates to inspecting the perfect soldering of surface-mountable external contacts onto a parent circuit board with the same number and arrangement of contact pads as the external contacts of the semiconductor device. The method comprises the following.

First, flux and solder is applied to the contact pads of the parent circuit board. Subsequently, the semiconductor device is aligned with the contact pads of the circuit board with visual checking of the surface-mountable external contacts in the edge regions on the underside of the semiconductor device. Thereafter, the solder is melted, the external contacts being mounted on the contact pads and the inspection tags being wetted by solder from the contact pads. Finally, the wetted inspection tags are visually inspected to make sure that the surface-mountable external contacts are soldered perfectly onto the contact pads of the parent circuit board.

To summarize, by special patterning of the interconnections on the underside of the semiconductor device, when the semiconductor device is soldered onto a circuit board, a solder meniscus is formed that can be inspected by simple means, so that conventional inspection systems can be used to determine whether or not the semiconductor device has been soldered on perfectly by its surface-mountable external contacts. In particular for the wafer level package method, this can be achieved by a side metallization of the edge faces of the semiconductor devices, which makes inspection easier.

In the following paragraphs, exemplary embodiments of the device and method are described in connection with the figures.

Figure 1:
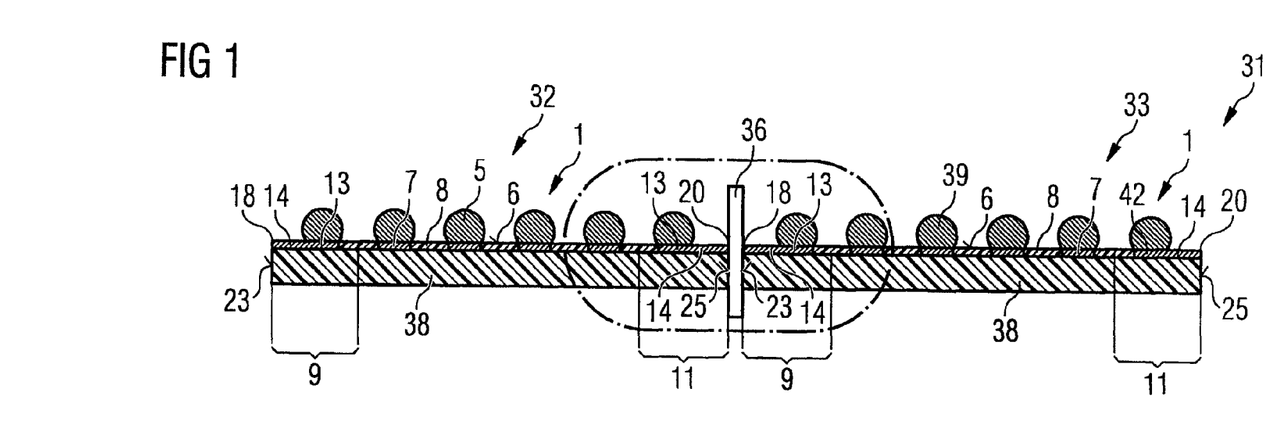
FIG. 1 shows a schematic cross-section through a panel for manufacturing semiconductor devices according to a first embodiment.

FIG. 1 shows a schematic cross-section through a panel 31 for manufacturing semiconductor devices 1 according to a first embodiment. FIG. 1 shows only two semiconductor device locations 32 and 33 from the panel 31, which comprises a plurality of semiconductor device locations. The panel 31 includes on its underside 6 an interconnect pattern 42 comprising a plurality of external contact pads 7, which are surrounded by a solder-resist layer 8. External contacts 5, which in this embodiment comprise solder balls 39, are arranged on the external contact pads 7.

In the outer edge regions 9 and 11 of the semiconductor device locations 32 and 33 are arranged external contact pads 13, which merge into, (i.e., are electrically connected to), inspection tags 14 that extend from the external contact pads 13 up to the lower outer edges 18 and 20 on the edge faces 23 and 25 respectively. The panel 31 includes a composite board comprising semiconductor devices and plastic packaging compound 38, which preferably form a common coplanar surface on which a multilayer interconnect pattern is arranged, as is known for the "wafer level package method" and also for the "universal package method".

The panel 31, however, may also comprise a composite board including a substrate on which are arranged semiconductor device locations, the underside of the substrate forming the underside 6 of the semiconductor devices, while on the top side, the semiconductor components are embedded in the plastic packaging compound 38. The semiconductor device locations 32 and 33 of the panel 31 are bounded by dicing tracks 36, in which a saw blade is preferably guided, which dices the semiconductor device locations 32 and 33 after fabrication of the panel 31.

Figure 2:
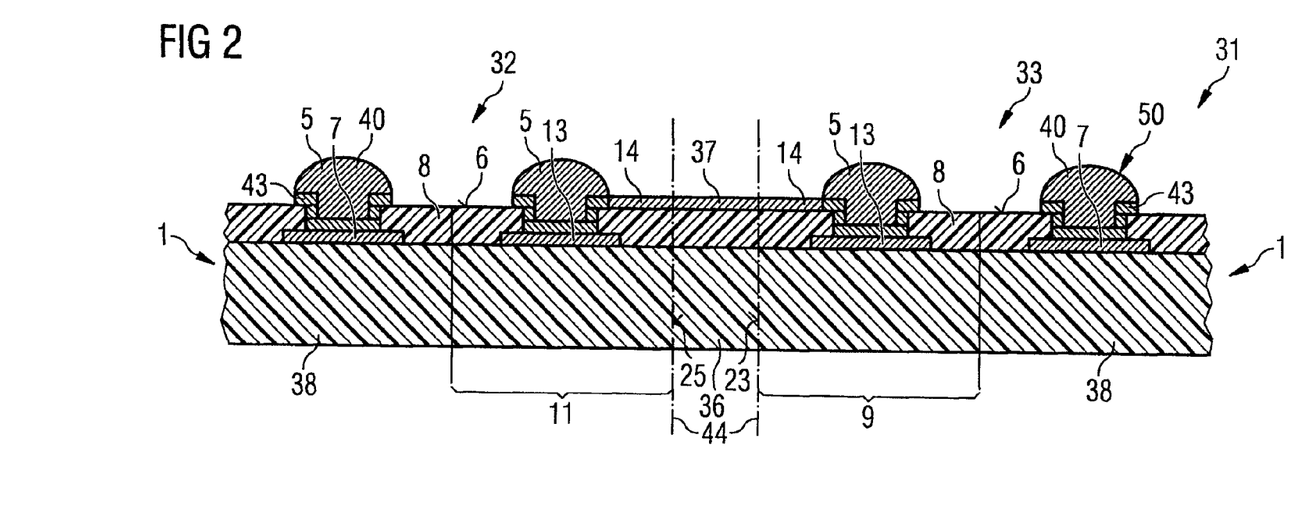
FIG. 2 shows an enlarged schematic cross-section through a sub-area of the panel of FIG. 1.

FIG. 2 shows an enlarged schematic cross-section through a panel 31 as shown in FIG. 1. Components with the same functions as in FIG. 1 are labeled with the same references and are not described further.

Two dotted-dashed lines 44 identify the limit of the dicing track 36. Part of the semiconductor device locations 32 is shown on the left-hand side of the dicing track 36, and the corresponding sub-area of the semiconductor device locations 33 is shown on the right-hand side. On the plastic packaging compound 38 of the panel 31, external contact pads 7 without inspection tags are arranged on the underside 6 of the panel 31, and in the edge regions 9 and 11 are arranged external contact pads 13 that merge into, (i.e., are electrically connected to), inspection tags 14.

The external contacts 5 are not arranged directly on the external contact pads 7 and 13, but instead an equalization layer 43 is arranged in-between, which is intended to absorb shear stresses arising from differences in the thermal expansion coefficients of the components of the panel 31. This equalization layer 43 is also known as a UBM (under bumper metallization). This UBM equalization layer is electrically conducting, so that the external contact pads 13 in the edge regions 9 and 11 are electrically connected to the inspection tags 14 via this equalization layer 43. The adjacent semiconductor device locations 32 and 33 include conductors 37 on the panel 31, which form inspection tags 14 on dicing along the dicing track 36. The UBM metallization can be used to create the conductors 37 crossing the dicing tracks 36 in order to avoid an additional metallization step.

Figure 3:
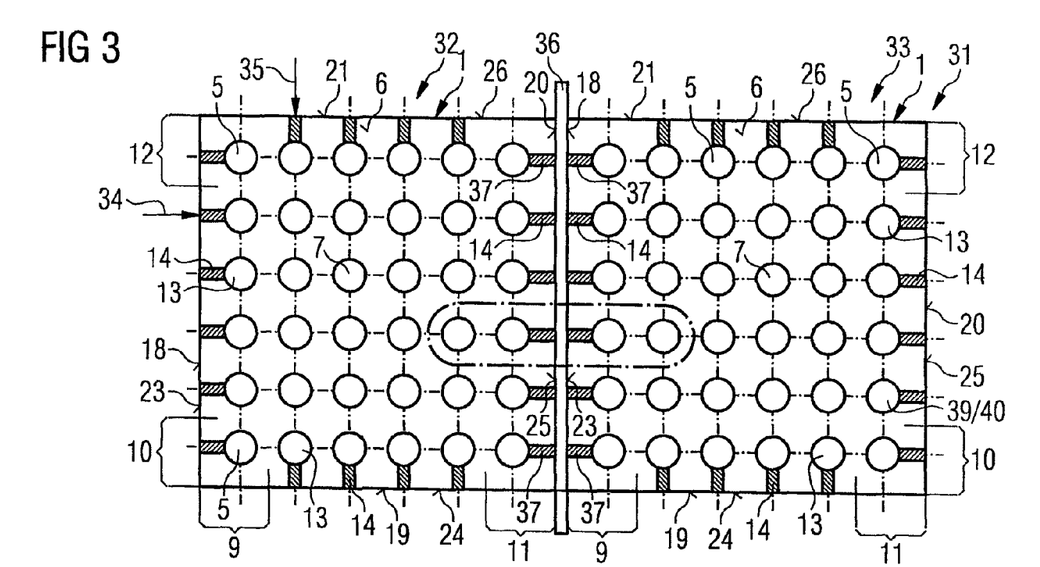
FIG. 3 shows a schematic diagram of the panel of FIG. 1 viewed from below.

FIG. 3 shows a view from below of the panel 31 of FIG. 1. In the semiconductor device locations 32 and 33, the panel 31 includes external contact pads 7 arranged in rows 34 and columns 35 in a central region, and external contact pads 13 in the edge regions 9, 10, 11 and 12. In the edge regions 9, 10, 11 and 12, the external contact pads 13 merge into, (i.e., being electrically connected to), inspection tags 14, which extend orthogonally from the row of the outer external contact pads 13 up to the lower outer edges 18, 19, 20 and 21 of the semiconductor device locations 32 and 33 respectively. On dicing the panel 31 along the dicing track 36, these inspection tags 14 extending up to the lower outer edges 18, 19, 20 and 21 are formed as a result of the conductors 37 crossing the dicing tracks 36. Instead of solder balls 39, external contact feet 40 having a somewhat mushroom-shaped cross-section 50 shown in FIG. 4 can also be deposited on the external contact pads 7 and 13.

Figure 4:
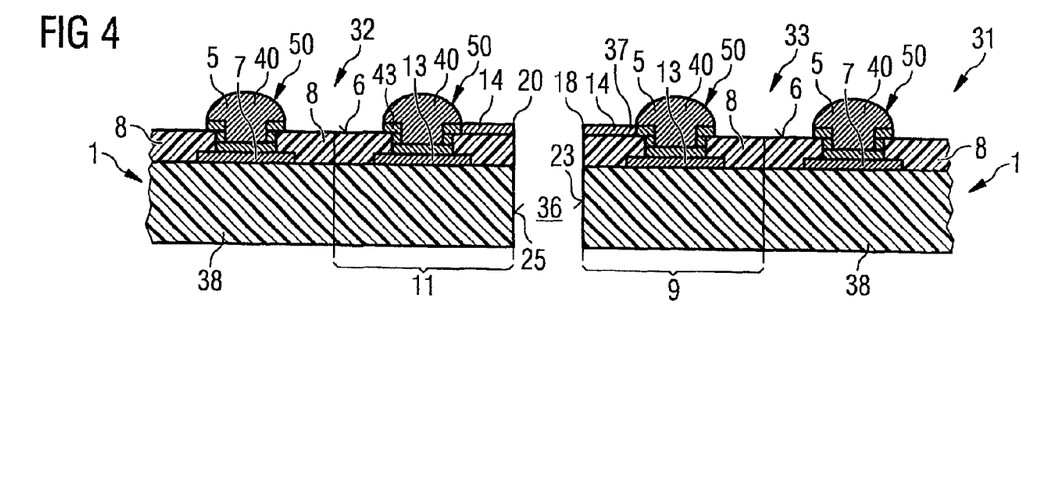
FIG. 4 shows an enlarged schematic cross-section through a sub-area of the panel of FIG. 1 after dicing the panel.

FIG. 4 shows an enlarged schematic cross-section through a sub-area of the panel 31 of FIG. 1 after dicing of the panel 31. The dicing track 36 comprising the thereby formed edge faces 25 and 23 of the two semiconductor devices 1 can be seen on one side in this cross-section, where an inspection tag 14 is provided up to the edge faces 23 and 25 for each of the external contacts 5 arranged on the edge regions 9 and 11. Such a semiconductor device 1 can now be surface mounted on a semiconductor device arrangement with a circuit board 28 shown in FIG. 5.

Figure 5:
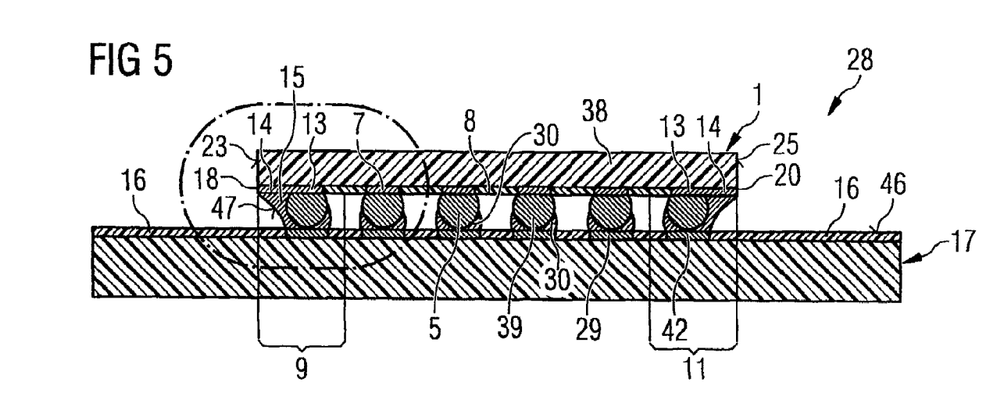
FIG. 5 shows a schematic cross-section through a semiconductor device arrangement with a semiconductor device as shown in FIG. 1.

FIG. 5 shows a schematic cross-section of a semiconductor device arrangement 28 with a semiconductor device 1 as shown in FIG. 1. This semiconductor device arrangement 28 comprises a semiconductor device 1 as shown in FIG. 1 and a circuit board 17 with an upper side 46, which includes an interconnect pattern 42 comprising contact pads 29 that are surrounded by a solder-resist layer 16, where the contact pads 29 match the external contact pads 7 and 13 of the semiconductor device 1 in terms of size and arrangement.

Solder 30 is arranged on the contact pads 29 of the circuit board 17, which during soldering on of the semiconductor device 1 by its surface-mountable external contacts 5, melts and wets the inspection tags 14 with solder 15 in the edge regions 9 and 11. Since these inspection tags 14 extend up to the lower outer edges 18 and 20 of the semiconductor device 1, in this semiconductor device arrangement 28, correct soldering of the external contacts 5 onto the external contact pads 29 can be checked, at least in the edge regions 9 and 11, via a low-cost, simple visual inspection of the inspection tags 14. The reliability that the surface-mountable external contacts 5 are connected to the parent circuit board 17 is thereby increased.

Figure 6:
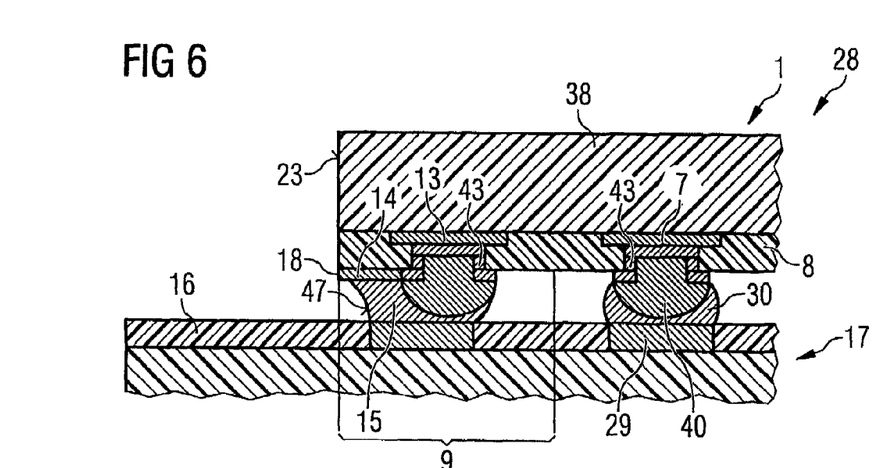
FIG. 6 shows an enlarged schematic cross-section through a sub-area of the semiconductor device arrangement of FIG. 5.

FIG. 6 shows an enlarged schematic cross-section through a sub-area of the semiconductor device arrangement 28 of FIG. 5. This sub-area is arranged in the edge region 9, wherein the semiconductor device 1 as mushroom-shaped, electroplated external contact feet 40 on a UBM equalization layer 43 in the exemplary embodiment of FIG. 6. The solder 15 and 30 of the contact pads 29 wets the outer sides of these external contact feet 40 and forms a solder meniscus 47 on the inspection tag 14 in the edge region 9, this meniscus allowing visual inspection of correct soldering of the semiconductor device 1 onto the parent circuit board 17. Since the inspection tags 14 extend to the lower outer edge 18 of the semiconductor device 1, the meniscus 47 at the edge faces 9 of the semiconductor device 1 is accessible for a visual inspection.

FIGS. 7 to 12 show details of a second embodiment. Components with the same functions as in FIGS. 1 to 6 are labeled in FIGS. 7 to 12 with the same references and are not described further.

Figure 7:
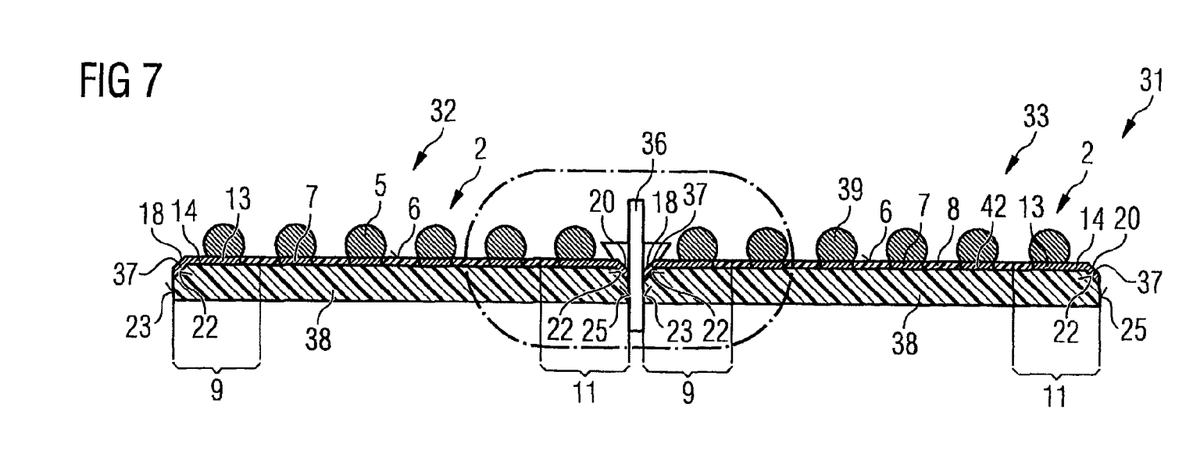
FIG. 7 shows a schematic cross-section through a panel for manufacturing semiconductor devices according to a second embodiment.

FIG. 7 shows a schematic cross-section through a panel 31 for manufacturing semiconductor devices 2 according to a second embodiment. A difference in the semiconductor device locations 32 and 33 of the second embodiment lies in the lower outer edges 18 and 20 being chamfered. Before applying inspection tags 14, a profile saw or profile etching is used to make a groove along the dicing tracks 36 that chamfers the lower outer edges 18 and 20 such that these outer edges 18 and 20 comprise chamfers 22. Conductors 37 are then deposited over these chamfers 22 between adjacent semiconductor devices 2 in the semiconductor device locations 32 and 33, these conductors including an inspection tag that fits onto the chamfers 22 of the lower outer edges 18 and 20 of the semiconductor device locations 32 and 33.

Figure 8:
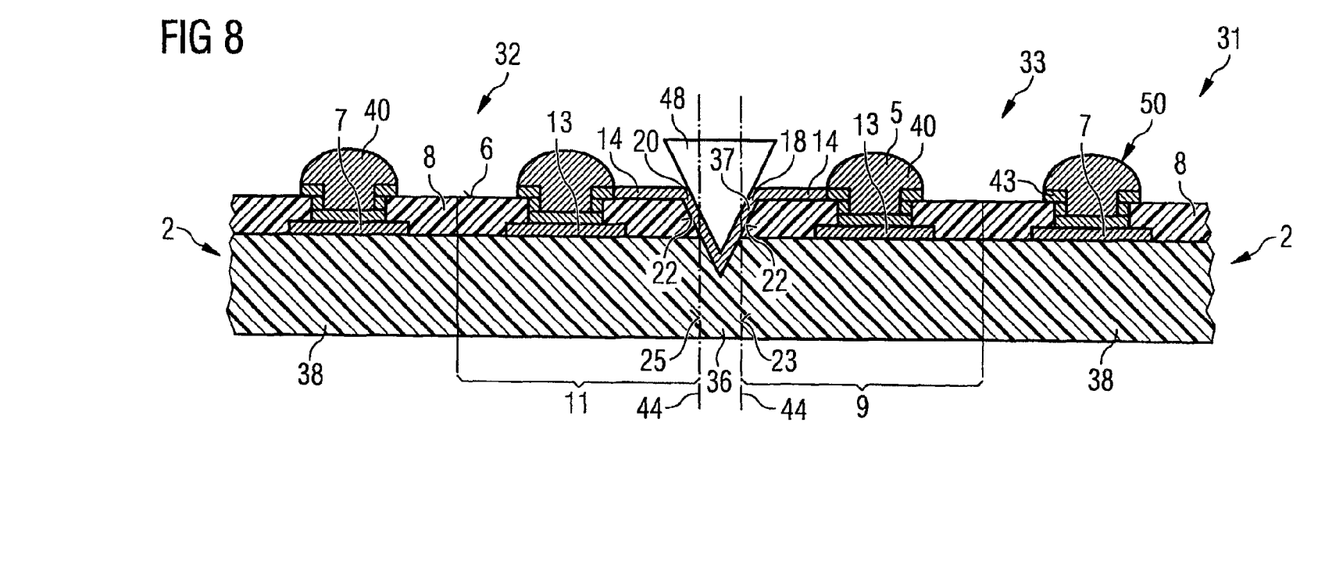
FIG. 8 shows an enlarged schematic cross-section through a sub-area of the panel of FIG. 7.

FIG. 8 shows an enlarged schematic cross-section through a sub-area of the panel 31 of FIG. 7. A triangle 48 represents the material etched away or the profile sawing along the dicing tracks 36 between the semiconductor device locations 32 and 33. This chamfering of the lower outer edges 18 and 20 is made prior to applying conductors 37, which connect together the external contact pads 13 in the edge regions 9 and 11. The dotted-dashed lines 44 again show the width of the dicing gap, which is made on dicing the semiconductor device locations 32 and 33 of the panel 31 after applying the conductors 37, so that wettable inspection tags 14 are left on the chamfers 22.

Figure 9:
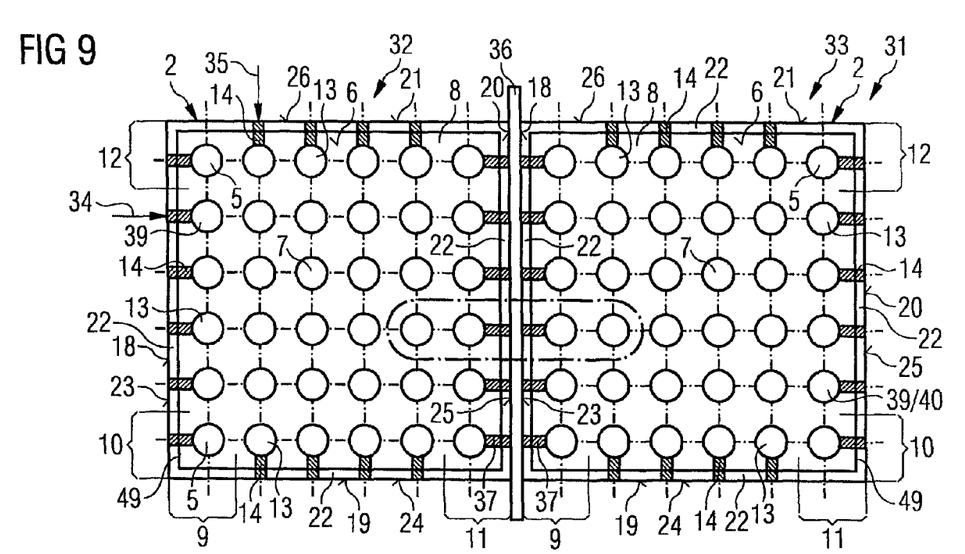
FIG. 9 shows a schematic diagram of the panel of FIG. 7 viewed from below.

FIG. 9 shows a schematic diagram of the panel 31 of FIG. 7 viewed from below. This schematic view from below shows the external contacts 5 arranged in rows 34 columns 35, wherein once again inspection tags 14 are arranged in the edge regions 9, 10, 11 and 12, these tags extending out beyond the continuous line 49 along the chamfers 22. The inspection tags 14 are thereby visible on the edge faces 23, 24, 25 and 26.

Figure 10:
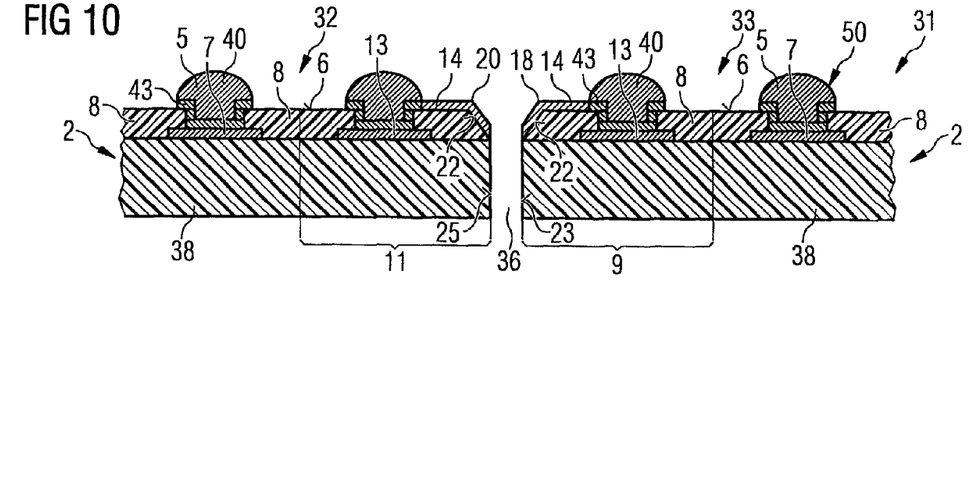
FIG. 10 shows an enlarged schematic cross-section through a sub-area of the panel of FIG. 7 after dicing the panel.

FIG. 10 shows an enlarged schematic cross-section through a sub-area of the panel 31 of FIG. 7 after dicing of the panel 31. This partial view shows clearly that the inspection tags 14 extend over the lower outer edges 18 and 20 and are also arranged on the chamfers 22. This allows for improved and simpler visual inspection of soldering of such semiconductor devices 2 onto a circuit board 17 shown in FIG. 11.

Figure 11:
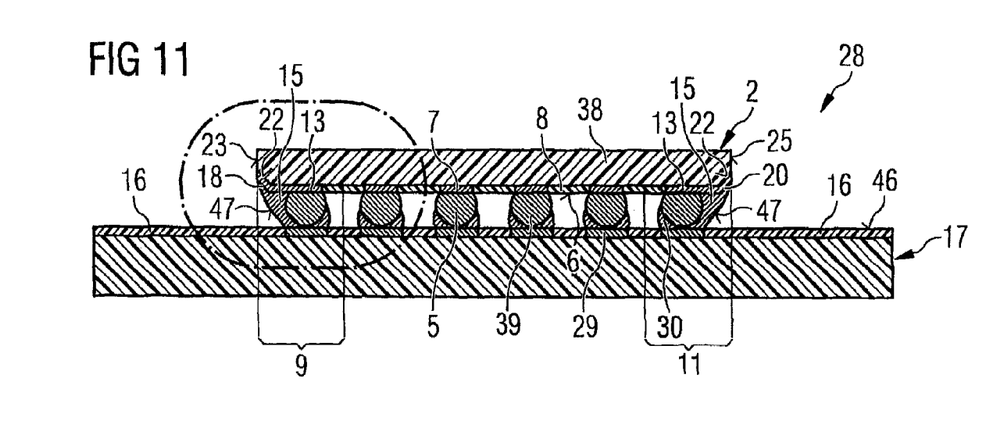
FIG. 11 shows a schematic cross-section through a semiconductor device arrangement with a semiconductor device as shown in FIG. 7.

FIG. 11 shows a schematic cross-section through a semiconductor device arrangement 28 comprising a semiconductor device 2 as shown in FIG. 7. In this embodiment, in the edge regions 9 and 11, the wetting solder 15 spreads up along the chamfers 22 up to the edge faces 23 and 25. This can be seen more clearly in the next figure, FIG. 12.

Figure 12:
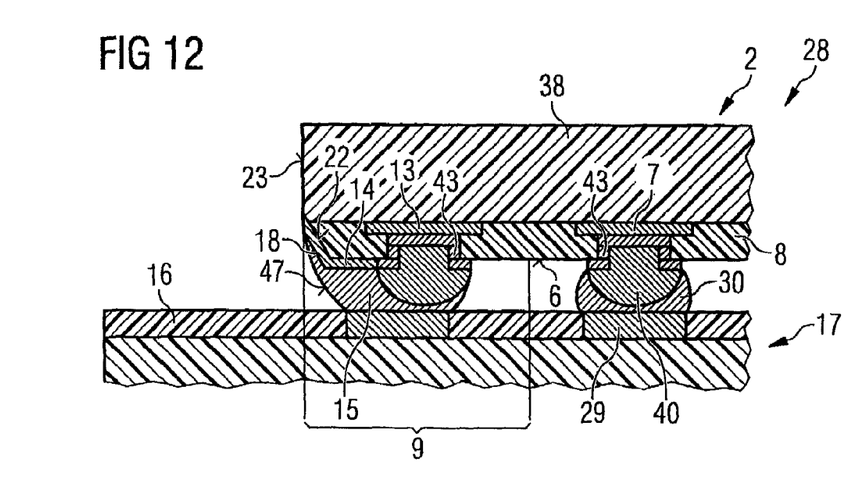
FIG. 12 shows an enlarged schematic cross-section through a sub-area of the semiconductor device arrangement of FIG. 11.

FIG. 12 shows an enlarged schematic cross-section through a sub-area of the semiconductor device arrangement 28 of FIG. 11. While the arrangement on the external contact pads 7 is unchanged compared with FIG. 6, in the edge region 9 it can be seen that the solder 15 spreads out over the chamfers 22 and wets the edge face 23 with the formation of a solder meniscus 47.

FIGS. 13 to 16 show a semiconductor device 3 of a third embodiment, wherein components including the same functions as in the previous figures are labeled in FIGS. 13 to 16 with the same references and are not described further.

Instead of chamfering the dicing tracks 36, as they are shown in the previous embodiment, in this third embodiment, recesses 41 are formed in the region of the dicing tracks 36 between the semiconductor device locations 32 and 33 of the panel 31. These recesses 41 can be formed via various procedures (e.g., laser ablation, etching and profiling a plastic packaging compound 38). Subsequently, these recesses 41 are metallized when the external contact pads 13 are metallized, such that an edge-face pattern 27 is produced in the cross-section comprising a metallized, angular recess 41. This can be seen in further detail in FIG. 14-16.

Figure 13:
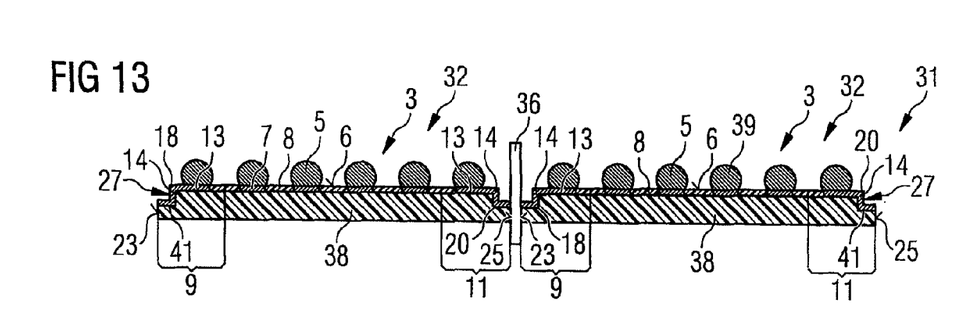
FIG. 13 shows a schematic cross-section through a panel for manufacturing semiconductor devices according to a third embodiment.
Figure 14:
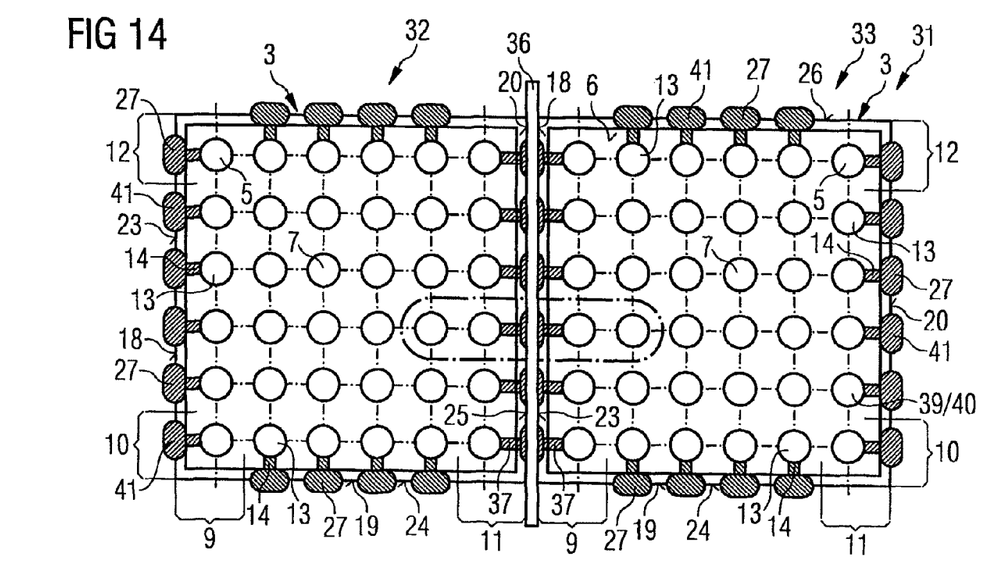
FIG. 14 shows a schematic diagram of the panel of FIG. 13 viewed from below.

FIG. 14 shows a schematic diagram of the panel 31 of FIG. 13 viewed from below. In this diagram, the metallized recesses 41 are arranged in the edge patterns 27, which in theory have an elongated oval shape. The width of the recesses 41 is distinctly larger than the width of the inspection tags 14 by themselves. Thereby, an edge-face pattern 27 on the edge faces 23, 24, 25, and 26 makes visual inspection even more straightforward and simple.

Figure 15:
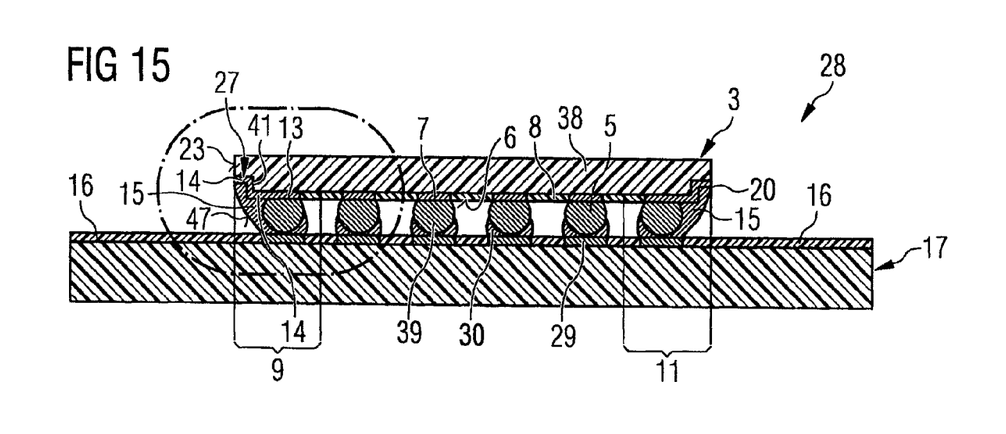
FIG. 15 shows a schematic cross-section through a semiconductor device arrangement with a semiconductor device as shown in FIG. 13.

FIG. 15 shows a schematic cross-section through a semiconductor device arrangement 28 including a semiconductor device 3 as shown in FIG. 13. This arrangement is formed via mounting the semiconductor device 3 on a parent circuit board 17, wherein the external contacts 5 are soldered onto corresponding contact pads 29 of the parent circuit board 17. In the central region, the solder 30 on the contact pads of the circuit board 17 wets the external contacts 5 in the same form as in the previous FIGS. 5 and 11. In the edge regions 9 and 11, however, the solder now spreads up into the sawn and metallized recesses 41 on the edge faces 23 and 25. This is shown more clearly in the next figure, FIG. 16.

Figure 16:
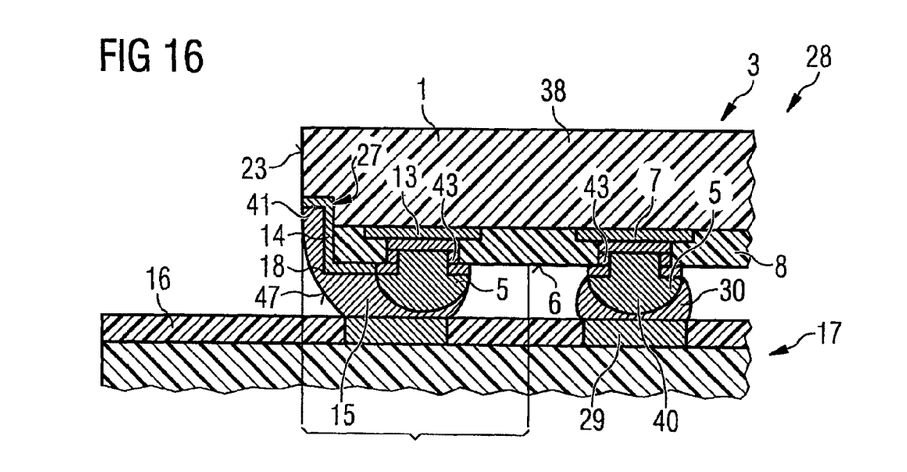
FIG. 16 shows an enlarged schematic cross-section through a sub-area of the semiconductor device arrangement of FIG. 15.

FIG. 16 shows an enlarged schematic cross-section through a sub-area of the semiconductor device arrangement 28 of FIG. 15. The meniscus 47 is even more pronounced here than in the previous exemplary embodiments, because it extends out over the edge-face patterns 27, and hence makes it possible to perform a reliable and straightforward visual inspection after soldering.

While the semiconductor device and method have been described in detail with reference to specific embodiments thereof, it will be apparent to one of ordinary skill in the art that various changes and modifications can be made therein without departing from the spirit and scope thereof. Accordingly, it is intended that the described semiconductor device and method cover the modifications and variations provided they come within the scope of the appended claims and their equivalents.

What is claimed is:

1. A semiconductor device, comprising:
surface-mountable external contact pads disposed on an underside of the semiconductor device, the surface-mountable external contact pads including edge region external contact pads disposed in an edge region of the semiconductor device;
a solder-resist layer disposed on the underside of the semiconductor device arranged adjacent and surrounding the surface-mountable external contact pads;
surface mountable external contacts arranged on the external contact pads; and
inspection tags respectively extending from the edge region external contact pads to edges of the semiconductor device, wherein the inspection tags are wettable by solder and are not covered by the solder-resist layer, the surface-mountable external contacts arranged on the edge region external contact pads extending onto the inspection tags, wherein the inspection tags are electrically isolated from each other in the edge region of the semiconductor device.

2. The semiconductor device as claimed in claim 1, wherein the inspection tags extends orthogonally from the edges of the semiconductor device to respective edge region external contact pads.

3. The semiconductor device as claimed in claim 1, wherein the edges of the semiconductor device include chamfers on which the inspection tags are arranged.

4. The semiconductor device as claimed in claim 1, wherein the edges of the semiconductor device include edge faces, and the inspection tags extend beyond the edges onto the edge faces.

5. The semiconductor device as claimed in claim 1, further comprising:
an interconnect pattern disposed on the underside of the semiconductor device, on which the surface-mountable external contact pads are arranged;
wherein the surface-mountable external contact pads are arranged in a ring formation in which the edge region external contact pads are arranged in an outer ring and the surface-mountable external contact pads not coupled to inspection tags are arranged on inner rings.

6. The semiconductor device as claimed in claim 1, further comprising:
a plurality of metalized edge-face patterns disposed on edge faces of the edges of the semiconductor device and electrically connected to the inspection tags.

7. A semiconductor device arrangement comprising:
a semiconductor device with an underside having edge regions, the semiconductor device including: a plurality of external contact pads disposed on the underside, a solder-resist layer disposed on the underside of the semiconductor device arranged adjacent and surrounding the external contact pads, a plurality of surface-mountable external contacts respectively disposed on the external contact pads, and a plurality of inspection tags disposed in the edge regions and extending from respective ones of the external contact pads, the solder-resist layer being structured so as not to cover the inspection tags; and
a parent circuit board comprising a plurality of circuit board contact pads with meniscus solder, the circuit board contact pads being arranged to match the surface-mountable external contacts of the semiconductor device in size and arrangement;
wherein the semiconductor device is soldered by the surface-mountable external contacts onto the circuit board contact pads such that the inspection tags are wetted by the solder of the circuit board contact pads.

8. The semiconductor device as claimed in claim 1, further comprising:
a plurality of equalization layers respectively disposed between and electrically connecting respective ones of the surface mountable external contact pads and the surface-mountable external contacts.

9. The semiconductor device as claimed in claim 8, wherein the equalization layers are configured to absorb shear stresses arising from differences in thermal expansion coefficients of the components of the semiconductor device.

10. The semiconductor device as claimed in claim 8, wherein the inspection tags are electrically connected to respective ones of the edge region external contact pads via respective ones of the equalization layers.

11. The semiconductor device arrangement as claimed in claim 7, wherein the semiconductor device further comprises:
a plurality of equalization layers respectively disposed between and electrically connecting respective ones of the external contact pads and the surface-mountable external contacts.

12. The semiconductor device arrangement as claimed in claim 11, wherein the equalization layers are configured to absorb shear stresses arising from differences in thermal expansion coefficients of the components of the semiconductor device.

13. The semiconductor device arrangement as claimed in claim 11, wherein the inspection tags are electrically connected to respective ones of the external contact pads via respective ones of the equalization layers.

* * * * *